United States Patent
Yamano et al.

(10) Patent No.: US 7,105,423 B2
(45) Date of Patent: Sep. 12, 2006

(54) METHOD OF MANUFACTURING SEMICONDUCTOR DEVICE

(75) Inventors: Takaharu Yamano, Nagano (JP); Nobuyuki Kurashima, Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 0 days.

(21) Appl. No.: 11/113,570

(22) Filed: Apr. 25, 2005

(65) Prior Publication Data
US 2005/0255686 A1 Nov. 17, 2005

(30) Foreign Application Priority Data
May 11, 2004 (JP) .............................. 2004-141527

(51) Int. Cl.
*H01L 21/46* (2006.01)
(52) U.S. Cl. ................ 438/460; 438/458; 438/E21.599

(58) Field of Classification Search ................ 438/113, 438/458, 460–465
See application file for complete search history.

(56) References Cited

U.S. PATENT DOCUMENTS
6,451,671 B1 * 9/2002 Yamada ...................... 438/460

FOREIGN PATENT DOCUMENTS
JP 2002-016173 1/2002

\* cited by examiner

*Primary Examiner*—Quoc Hoang
(74) *Attorney, Agent, or Firm*—Ladas & Parry LLP

(57) ABSTRACT

A method of manufacturing a semiconductor device having a build-up layer for wiring between semiconductor elements and external connection terminals is disclosed. The method comprises steps of forming a rewiring layer on a wafer, placing the wafer on a stretchable dicing tape, dicing the wafer placed on the dicing tape, forming a clearance between adjacent semiconductor elements by stretching the dicing tape, forming a semiconductor device continuous body by forming a build-up layer on the semiconductor elements and the clearance, and forming semiconductor devices by dicing the semiconductor device continuous body.

7 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly relates to a method of manufacturing a semiconductor device having a build-up layer for wiring between semiconductor elements and external connection terminals.

2. Description of the Related Art

In recent years, LSI technologies as a key technology for multimedia devices have been steadily advanced to improve data transmission speed and capacity. With the advancement of the LSI technologies, high-density mounting techniques for interfaces between LSIs and electronic devices have also been developed. Among semiconductor packages, CSPs (Chip Size Package), whose size is substantially equal to the chip size, can offer high-density mountability.

Although there are a variety of types of CSPs, most of the CSPs are configured to have an interposer between semiconductor elements and connection terminals (e.g. solder bumps) for external connection. This is because pads on semiconductor elements are highly accurately formed by a wafer process whereas external connection terminals only need to be accurate enough to satisfy pitch based on wiring rules and therefore do not have accuracy as high as the accuracy of the pads. Therefore, an interposer is provided between the semiconductor elements and the external connection terminals.

Resin substrates have been used as interposers, and a wire bonding method or a flip-chip bonding method has been employed for connecting semiconductor elements to an interposer. However, as density of semiconductor elements grows and their size decreases, it is becoming difficult to form electrodes on a resin substrate to correspond to pads of semiconductor elements due to an accuracy difference between the semiconductor elements and the resin substrate. As a result, resin substrates are becoming less appropriate as interposers for CSPs.

In view of these circumstances, Japanese Patent Laid-Open Publication No. 2002-16173 discloses a semiconductor device manufacturing method wherein an interposer for a CSP is formed by a build-up method. According to this semiconductor device manufacturing method, a wafer is divided into semiconductor elements by a dicing process. Each of the semiconductor elements is mounted on a recessed part formed on a substrate. Then, an insulating layer having an inter-layer conductive part is formed thereon. Further, a build-up layer electrically connected to the inter-layer conductive part is formed by a build-up process.

However, in the case where a build-up process is performed after dividing a wafer into semiconductor elements and mounting the semiconductor elements on the substrate as described above, the semiconductor elements need to be accurately positioned on the substrate if the semiconductor elements have high density and high accuracy. Therefore, positioning of the semiconductor elements becomes difficult. Besides, when the semiconductor elements are separated before the build-up process, handling of the separated semiconductor elements is troublesome.

A solution for these problems may be semiconductor device manufacturing methods based on a wafer level process that are designed to form a build-up layer at a wafer level, i.e., before dividing semiconductor elements provided on a wafer. According to the methods based on the wafer level process, however, the area of a build-up layer has the same size as the area of semiconductor elements separated by the dicing, and cannot be formed wider than that. This results in low flexibility of wiring arrangement of the build-up layer.

SUMMARY OF THE INVENTION

A general object of the present invention is to provide a method of manufacturing a semiconductor device to solve at least one problem described above. A specific object of the present invention is to provide a method of easily manufacturing a high-accuracy semiconductor device that allows a highly-flexible wiring arrangement.

To achieve the forgoing and other objects, the present invention provides a method of manufacturing a semiconductor device that comprises a first wiring layer forming step of forming a first wiring layer on an element forming surface of a semiconductor substrate on which plural semiconductor elements are formed, a first dividing step of placing the semiconductor substrate on a stretchable base film with the element forming surface facing upward and performing a first dividing process where the semiconductor substrate placed on the base film is divided such that the plural semiconductor elements are separated from each other, a clearance forming step of forming a clearance between the adjacent semiconductor elements by stretching the stretchable base film after the first dividing step, a semiconductor element encapsulating step of encapsulating the separated plural semiconductor elements and filling the clearance between the adjacent semiconductor elements with a resin, a via forming step of forming vias on the resin at positions corresponding to the first wiring layer, a semiconductor device continuous body forming step of forming a semiconductor device continuous body by forming a second wiring layer on a surface of the resin such that the second wiring layer is connected to the first wiring layer through the vias, and a second dividing step of performing a second dividing process where the semiconductor device continuous body is divided into plural of the semiconductor devices by cutting within the clearance.

According to the present invention, after the semiconductor substrate is divided, the stretchable base film is stretched to form the clearance between the adjacent semiconductor elements. The second wiring layer is formed thereafter, so that the area of the second wiring layer extends over the clearance as well as the semiconductor elements. Therefore, design flexibility of the second wiring layer is improved. Also, the size of the area of the second wiring layer is tolerant of size changes of the semiconductor elements. That is, even when the size of the semiconductor elements is changed, the size change can be easily accommodated by adjusting the length of the clearance.

In the method of manufacturing a semiconductor device, it is preferable that the stretchable base film include a stretchable dicing tape.

With use of the dicing tape, the clearance forming step can be continuously performed after the first dividing process. This simplifies a manufacturing process of the semiconductor device and improves manufacturing efficiency.

In the method of manufacturing a semiconductor device, it is also preferable that the first wiring layer forming step comprise steps of forming electrodes and an insulating film made of a metal-containing resin so as to be exposed on the semiconductor substrate, forming a seed layer on the electrodes and the insulating film by electroless plating, forming a metal film pattern by electrolytic plating while using the seed layer as a power supply layer, and forming the first wiring layer by etching the seed layer while using the metal film pattern as a mask.

Having the steps described above eliminates the need for an expensive sputtering apparatus for forming the seed layer. Therefore, the seed layer is formed at low cost on a normal production line without a special investment in facilities. Thus, manufacturing costs of the semiconductor device can be substantially lowered.

In the method of manufacturing a semiconductor device, it is also preferable that the metal-containing resin include an epoxy resin containing palladium.

In the method of manufacturing a semiconductor device, it is also preferable that the semiconductor device continuous body manufacturing step comprise a step of forming the second wiring layer having multiple layers on the resin on which the vias are formed by a build-up method.

According to this method, the second wiring layer is formed on the resin encapsulating the plural semiconductor elements and filling the clearance. Therefore, the second wiring layer can offer high accuracy and high reliability.

In the method of manufacturing a semiconductor device, it is also preferable that a dicing process be used in the first and second dividing processes.

If the dicing process is used for both the first and second dividing processes as described above, both of the dividing processes can be performed by a single dicing apparatus. As a result, costs required for the dividing processes are reduced.

It is also preferable that the method of manufacturing a semiconductor device further comprise a backgrinding step of grinding a back surface opposite to the element forming surface of the semiconductor substrate before the first dividing step.

Grinding the back surface of the semiconductor substrate reduces the thickness of the semiconductor substrate, and therefore the semiconductor substrate is easily and efficiently cut and divided.

DETAILED DESCRIPTION OF THE PREFERRED EMBODIMENT

A preferred embodiment of the present invention is described hereinafter with reference to the accompanying drawings.

Figure 1:
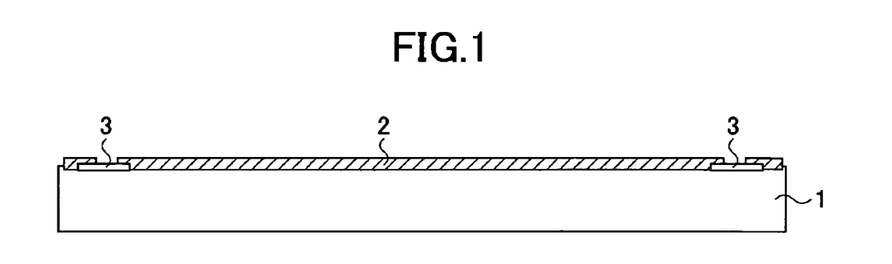
FIG. 1 illustrates a first wiring layer forming step according to a method of manufacturing a semiconductor device as an embodiment of the present invention.

FIGS. 1 through 17 illustrate a method of manufacturing a semiconductor device as an embodiment of the present invention step by step. According to the method of manufacturing a semiconductor device of the present invention, a semiconductor substrate 1 as shown in FIG. 1 is used.

The semiconductor substrate 1 is a silicon wafer (hereinafter referred to as wafer 1) having plural semiconductor elements formed in advance. Each of the semiconductor elements serves as, for example, a memory. Aluminum electrodes 3 are formed on the outer side of an element area. A passivation film is formed on a front surface (element forming surface) of the wafer 1 except the area where the aluminum electrodes 3 are formed. The passivation film 2 may include silicon nitride (Sin) film.

Although the plural semiconductor elements are formed on the wafer 1, FIGS. 1 through 7 illustrate only one semiconductor element out of the plural semiconductor elements formed on the wafer 1 for the purpose of simplifying the description. FIGS. 8 through 17 illustrate adjacent two semiconductor elements out of the plural semiconductor elements formed on the wafer 1 for the same purpose.

Figure 2:
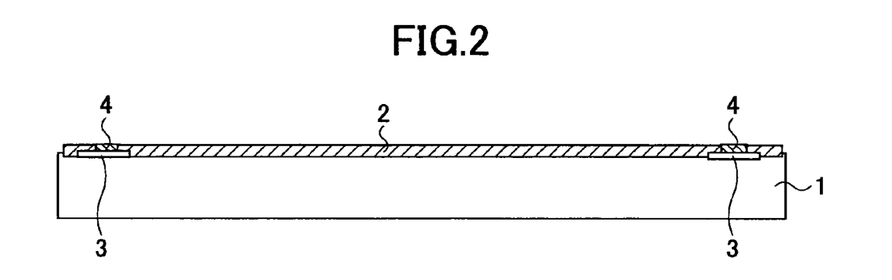
FIG. 2 illustrates the first wiring layer forming step according to the method of manufacturing a semiconductor device as an embodiment of the present invention.

Referring to FIG. 2, a nickel film 4 is formed on the aluminum electrodes 3 on the wafer 1 by electroless plating. Holes in the passivation film 2 on the aluminum electrodes 3 are thus covered with the nickel film 4.

Then, a photosensitive resin coating is applied (or a film is adhered) on the upper surface of the passivation film 2 to form an insulating film 5 having a thickness of, e.g., 10 through 20 µm. The insulating film 5 may be made of metal-containing resin or siloxane-based resin.

The metal-containing resin may include resin in which metal particles serving as plating catalysts are dispersed. Compounds (e.g. chloride, hydroxide, oxide) of metals serving as plating catalysts may be used alternatively. The metals serving as catalysts include palladium and platinum, etc. Especially, palladium compounds such as palladium chloride and palladium sulfate are preferable.

The resin may preferably be epoxy resin and polyimide resin although not limited thereto. Namely, the metal-containing resin may be any resin containing some kind of plating catalyst. A preferred example of the metal-containing resin includes photosensitive epoxy-based resin that contains approximately 1% of palladium (Pd) serving as a catalyst in electroless plating and has a Young's modulus of 4 GPa.

A preferred example of the siloxane-based resin includes a negative photosensitive material (siloxane content: 10 through 70%) that is based on siloxane resin made of highly heat resistant aromatic resin components and has a Young's modulus of 90 through 500 MPa.

Figure 3:
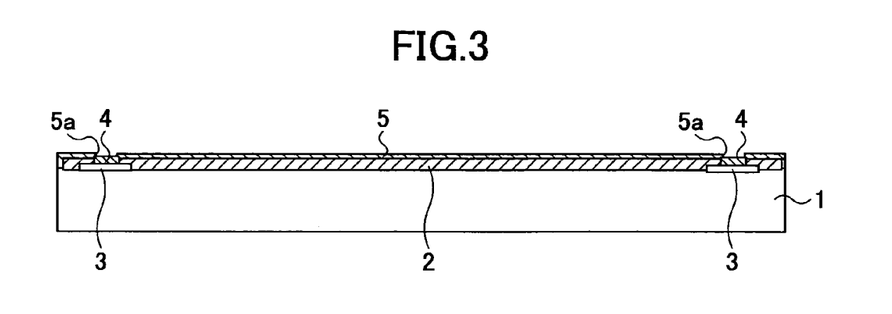
FIG. 3 illustrates the first wiring layer forming step according to the method of manufacturing a semiconductor device as an embodiment of the present invention.

Referring then to FIG. 3, openings 5a are formed on the insulating film 5 on the aluminum electrodes 3 by exposure and development using a photolithographic method. Then, the insulating film 5 is cured by heating. The nickel film 4 is thus exposed through the openings 5a.

Figure 4:
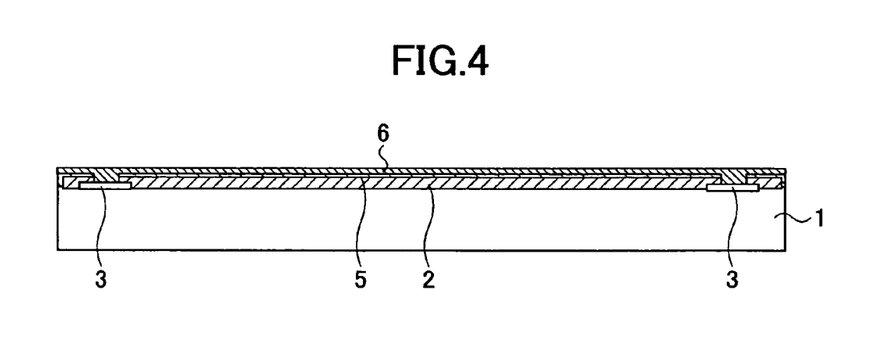
FIG. 4 illustrates the first wiring layer forming step according to the method of manufacturing a semiconductor device as an embodiment of the present invention.

Then, as shown in FIG. 4, a seed layer 6 having a thickness of 1 µm is formed on the insulating film 5 and the nickel film 4 by electroless plating. The seed layer 6 in this embodiment is made of nickel (Ni). When the seed layer 6 is formed on the insulation film 5 made of the metal-containing resin as described above, palladium is exposed on the surface of the metal-containing resin. As electroless plating is performed having such insulating film 5 as an under layer, plating is surely formed and therefore the seed layer 6 having desired film characteristics can be obtained.

In this embodiment, as explained above, since the insulating film (metal-containing resin) 5 that contains palladium serving as an electroless plating catalyst is formed on the wafer 1, the seed layer 6 can be formed by electroless plating. Therefore, there is no need to have an expensive sputtering apparatus for forming the seed layer 6, thereby substantially reducing manufacturing costs.

While the seed layer 6 is formed on the insulating film 5 by electroless plating in this embodiment, the method for forming the seed layer 6 is not limited thereto. For example, a seed layer made of copper (Cu) may be formed on the passivation film 2 and the nickel film 4 by a sputtering method.

After the seed layer 6 is formed, a resist (not shown) having openings corresponding to a rewiring layer 7 (to be discussed below) is formed on the wafer 1. Then, the rewiring layer 7 made of copper and having a thickness of 5 through 20 µm is formed in the openings of the resist by electrolytic plating while using the seed layer 6 as a power supply layer.

Figure 5:
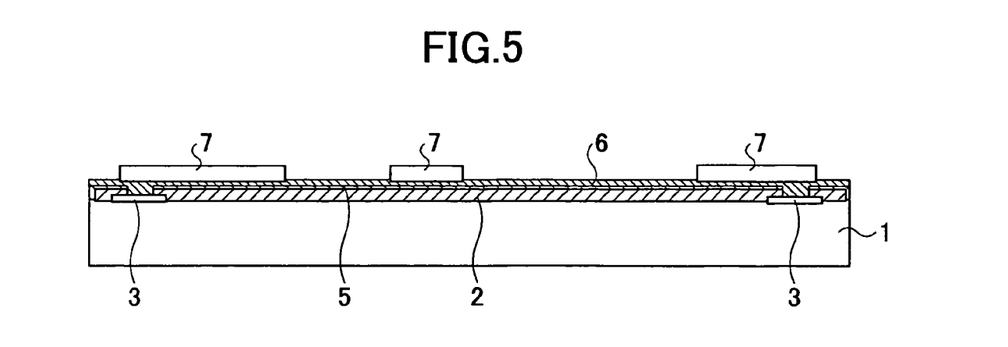
FIG. 5 illustrates the first wiring layer forming step according to the method of manufacturing a semiconductor device as an embodiment of the present invention.
Figure 6:
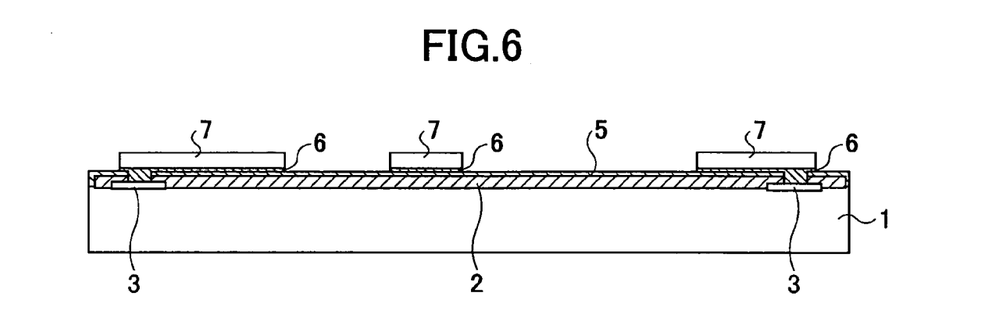
FIG. 6 illustrates the first wiring layer forming step according the method of manufacturing a semiconductor device as an embodiment of the present invention.

When the resist is removed, the seed layer 6 is exposed except the area where the rewiring layer 7 is formed (FIG. 5). The seed layer 6 thus partly masked by the rewiring layer 7 is then etched, so that the insulating film 5 is exposed except where the rewiring layer 7 is formed (FIG. 6). With all these processes, the rewiring layer 7 is completed. The processes described with reference to FIGS. 1 through 6 correspond to "a first wiring layer forming step" as set forth in the following claims.

Figure 7:
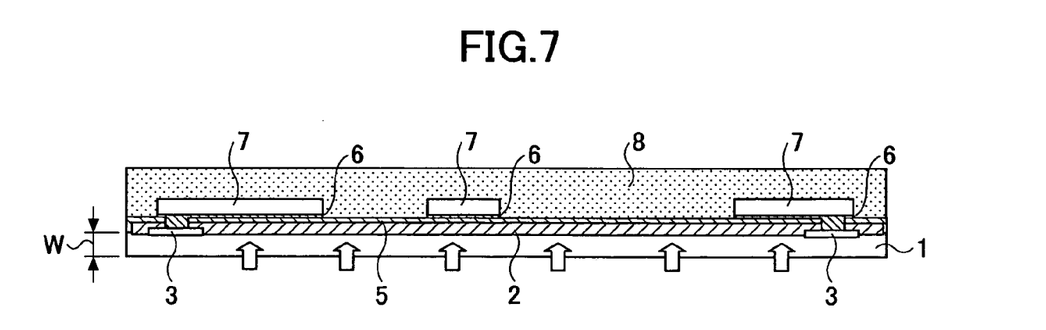
FIG. 7 illustrates a backgrinding step according to the method of manufacturing a semiconductor device as an embodiment of the present invention

After the rewiring layer 7 is completed, a backgrinding tape is adhered on the surface of the wafer 1 where the rewiring layer 7 is formed. The wafer 1 is loaded on a grinding machine for a backgrinding process. With the backgrinding process, a thickness W of the wafer 1 is reduced as shown in FIG. 7 to, for example, around 20 through 50 µm. In this way, backgrinding of the semiconductor elements is performed at a wafer level, and thickness of the semiconductor elements is efficiently reduced.

Figure 8:
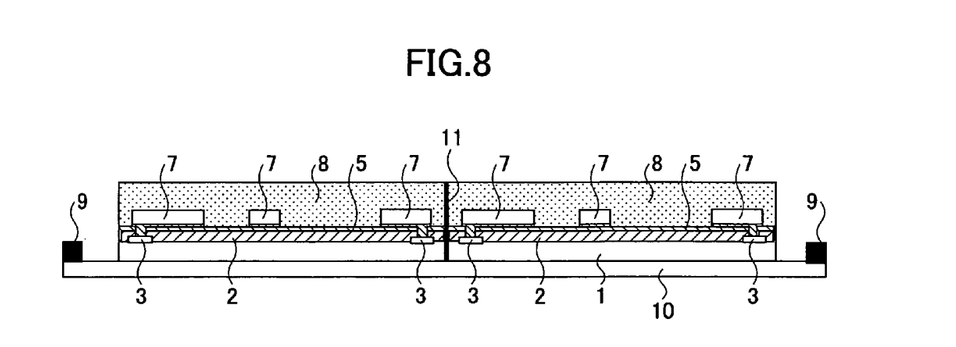
FIG. 8 illustrates a first dividing step according to the method of manufacturing a semiconductor device as an embodiment of the present invention.

When the backgrinding process is finished, the wafer 1 is adhered on a dicing tape 10 as illustrated in FIG. 8. The dicing tape 10 is held by a dicing frame 9 having a ring shape. As adhesive materials are arranged on the front surface of the dicing tape 10, and a back surface of the wafer 1 is adhered to the dicing tape 10. Once the wafer 1 is adhered to the dicing tape 10, the backgrinding tape 8 is removed.

The dicing tape 10 is stretchable, which serves as a stretchable base film set forth in the following claims. Therefore, the dicing tape 10 stretches with application of a tension force as discussed below.

Figure 9:
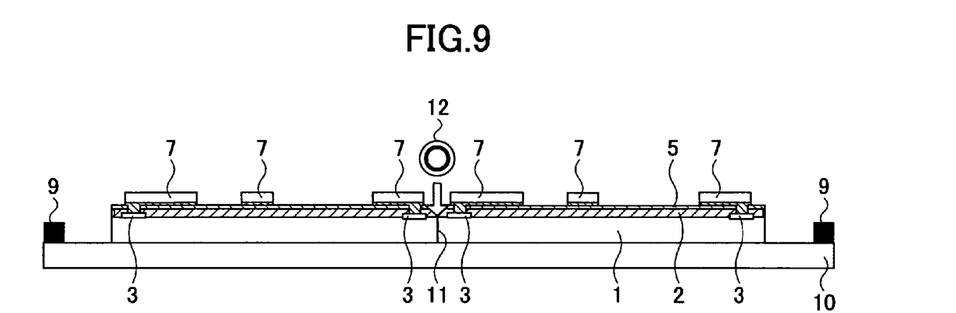
FIG. 9 illustrates the first dividing step according to the method of manufacturing a semiconductor device as an embodiment of the present invention.

After the backing tape 8 is removed, the wafer 1 is loaded in a dicing apparatus to be diced (or divided) at a predetermined dicing position 11 by a dicing blade 12 (FIG. 9). The wafer 1 is thus divided into the plural semiconductor element separated from each other (hereinafter the separated semiconductor elements are referred to as semiconductor elements 1A).

Although a relatively large force is applied to the wafer 1 during the dicing process, the semiconductor elements 1A are adhered on the dicing tape 10 without being released from the dicing tape 10. In the present embodiment, the wafer 1 undergoes the backgrinding process prior to the dicing process, so the thickness of the wafer 1 to be cut is reduced. Therefore, the dicing process is efficiently performed. The processes described with reference to FIGS. 7 through 9 correspond to "a first dividing step" as set forth in the following claims. Even if a part of the dicing tape 10 is cut by the dicing blade 12 in a thickness direction of the dicing tape 10 during the dicing process, this would not be a problem because the dicing tape 10 is stretched in the following step.

Figure 10:
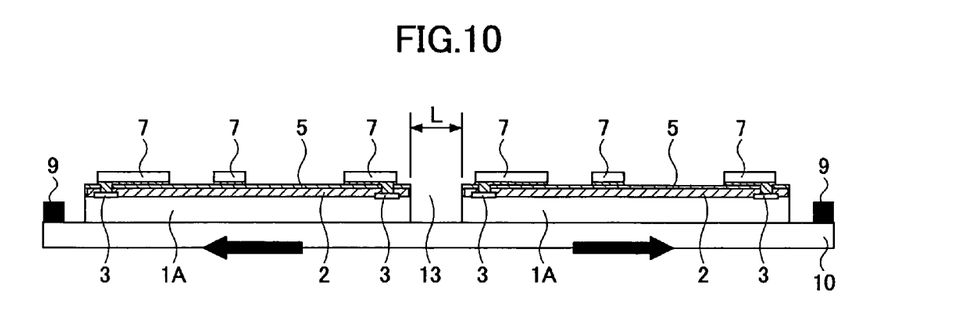
FIG. 10 illustrates a clearance forming step according to the method of manufacturing a semiconductor device as an embodiment of the present invention.

When the dicing process is completed, a tension force is applied to the dicing tape 10 in its radial outer directions as indicated by arrows in FIG. 10. Since the dicing tape 10 is stretchable as previously mentioned, the dicing tape 10 stretches due to the tension force. The tension force is set to be uniformly applied to the dicing tape 10.

When the dicing tape 10 is thus stretched with the application of the tension force in its radial outer directions, a clearance 13 is formed between the adjacent semiconductor elements 1A. A length L of the clearance 13 may be set as desired within a stretchable range of the dicing tape 10. The length L of the clearance 13 may be determined based on the size of the semiconductor elements 1A and a formation area of a build-up layer 16 (to be discussed below).

In the present embodiment, the clearance 13 is formed using the dicing tape 10. The dicing tape 10 carries out the original function, i.e., holds the semiconductor elements 1A in the dicing process, and serves to form the clearance 13 in the stretching process.

Accordingly, the dicing process and the process of forming the clearance 13 can be continuously performed with use of the dicing tape 10, thereby improving manufacturing efficiency of the semiconductor device and simplifying manufacturing processes. The processes described with reference to FIGS. 7 through 10 correspond to "a clearance forming step" as set forth in the following claims.

After the clearance 13 is formed between the adjacent semiconductor elements 1A as described above, a sealing resin 14 for encapsulating the semiconductor elements 1A is formed on the dicing tape 10. The sealing resin 14 is formed on the dicing tape 10 by a vacuum lamination process.

Figure 11:
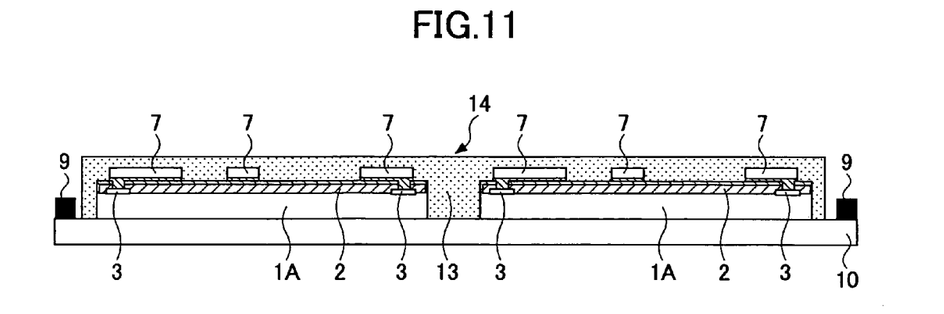
FIG. 11 illustrates a semiconductor device continuous body forming step according to the method of manufacturing a semiconductor device as an embodiment of the present invention.

For example, a resin sheet made of epoxy-based resin is put on the dicing tape on which the semiconductor elements 1A are arranged, and vacuum processing is conducted. The resin sheet is thus tightly fitted (or laminated) on the semiconductor elements 1A, so that the sealing resin 14 encapsulating the semiconductor elements 1A and the clearance 13 is formed as shown in FIG. 11. After the sealing resin 14 is formed, the upper surface of the sealing resin 14 may be made smooth and flat. The sealing resin 14 may be formed by other methods such as application of liquid resin and a potting method, etc.

Figure 12:
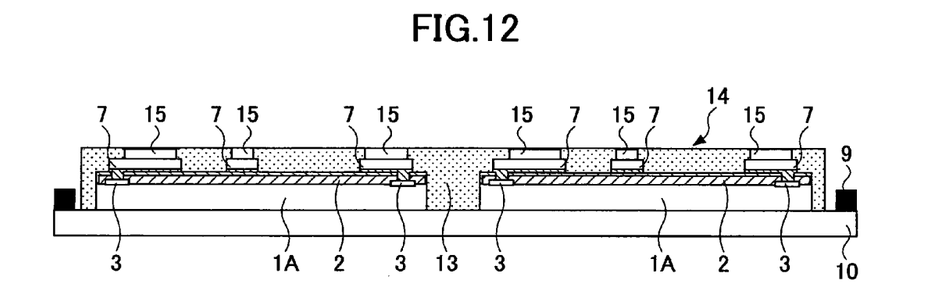
FIG. 12 illustrates the semiconductor device continuous body forming step according to the method of manufacturing a semiconductor device as an embodiment of the present invention.

After that, through holes 15 are formed at predetermined positions on the sealing resin 14 corresponding to positions where the rewiring layer 7 remains. While the through holes 15 are formed by laser machining in this embodiment, etching may alternatively be used to form the through holes 15. FIG. 12 shows the through holes 15 formed at the predetermine positions on the sealing resin 14.

Then, the build-up layer 16 is formed on the sealing resin 14. The sealing resin 14 serves as a base plate for forming the build-up layer 16. The build-up layer 16 may be formed by any of well-known build-up methods including additive methods and subtractive methods.

In the present embodiment, a build-up method based on a semi-additive method is used for forming the build-up layer 16. Specifically, the build-up layer 16 having a predetermined number of lamination layers is formed by repeating processes including copper patterning on the sealing resin 14, lamination of the build-up layer, laser beam drilling for creating through holes, electroless copper plating, and etching of the electroless copper plating. A wiring layer (second wiring layer) formed by the build-up method extends on the sealing resin 14 filling the clearance 13.

Figure 13:
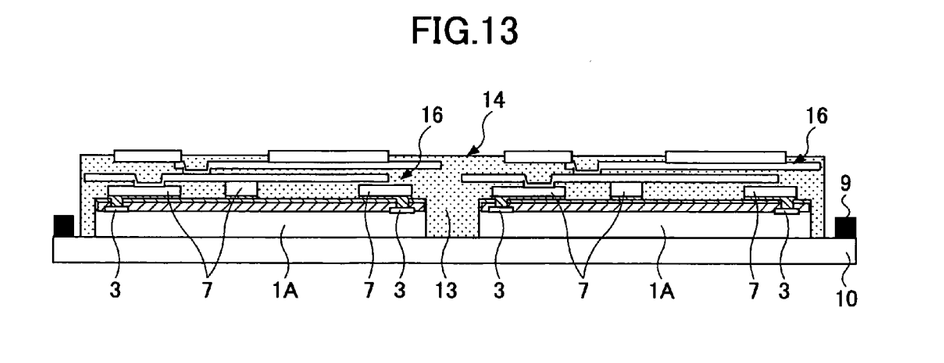
FIG. 13 illustrates the semiconductor device continuous body forming step according to the method of manufacturing a semiconductor device as an embodiment of the present invention.

After the build-up layer 16 is formed, a solder resist 17 is formed on the build-up layer 16. The solder resist 17 may be formed by a printing method. In the case where the printing method is employed, the solder resist 17 and openings 18 can be formed at the same time.

The openings 18 are formed at positions corresponding to solder bumps (external connection terminals) 21 which are discussed below in detail. A copper pattern formed on a top layer of the build-up layer 16 is exposed through the openings 18.

After the solder resist 17 having the openings 18 is formed, barrier metal portions 19 are formed inside the respective openings 18. The barrier metal portion 19 of this embodiment is a lamination of nickel (Ni) and gold (Au). The barrier metal portion 19 may be formed by, for example, an electroless plating method.

Figure 14:
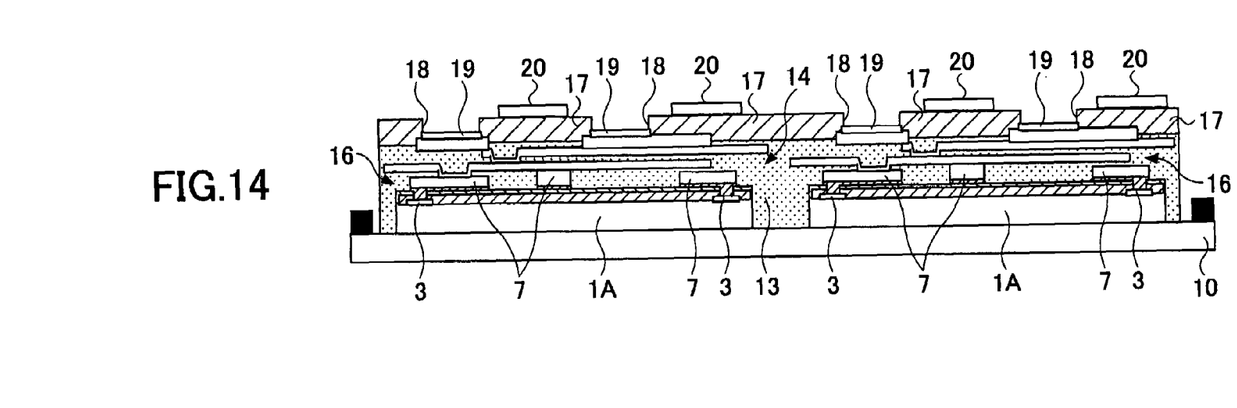
FIG. 14 illustrates the semiconductor device continuous body forming step according to the method of manufacturing a semiconductor device as an embodiment of the present invention.

After forming the barrier metal portions 19, passive element chips such as chip capacitors 20 are formed on the upper face of the solder resist 17 according to need. FIG. 14 illustrates a state where the solder resist 17, the barrier metal portions 19 and the chip capacitors 20 are formed in the manner described above.

Figure 15:
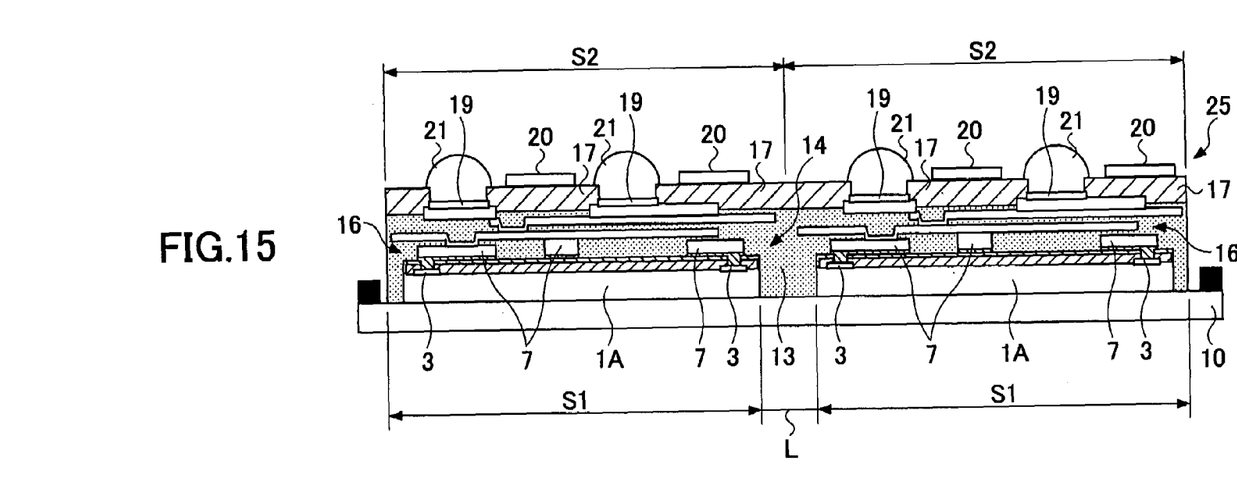
FIG. 15 illustrates the semiconductor device continuous body forming step according to the method of manufacturing a semiconductor device as an embodiment of the present invention.

Then, the solder bumps 21 are formed on the respective barrier metal portions 19. Each of the solder bumps 21 may be formed by providing a solder ball on the corresponding barrier metal portion 19 and reflowing the solder ball onto the barrier metal portion 19. FIG. 15 illustrates a state where the solder bumps 21 are formed.

With these processes, a semiconductor device continuous body 25 is formed that has the united plural semiconductor elements 1A on which the build-up layer 16 is formed. The processes described with reference to FIGS. 11 through 15 correspond to "a semiconductor device continuous body forming step" as set forth in the following claims.

Figure 16:
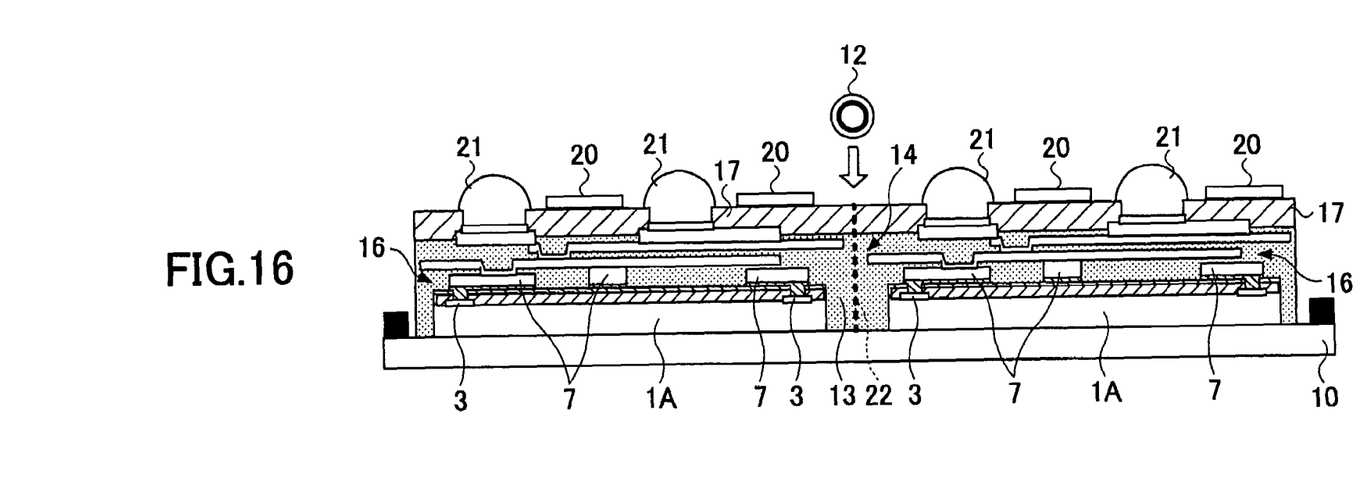
FIG. 16 illustrates a second dividing step according to the method of manufacturing a semiconductor device as an embodiment of the present invention.
Figure 17:
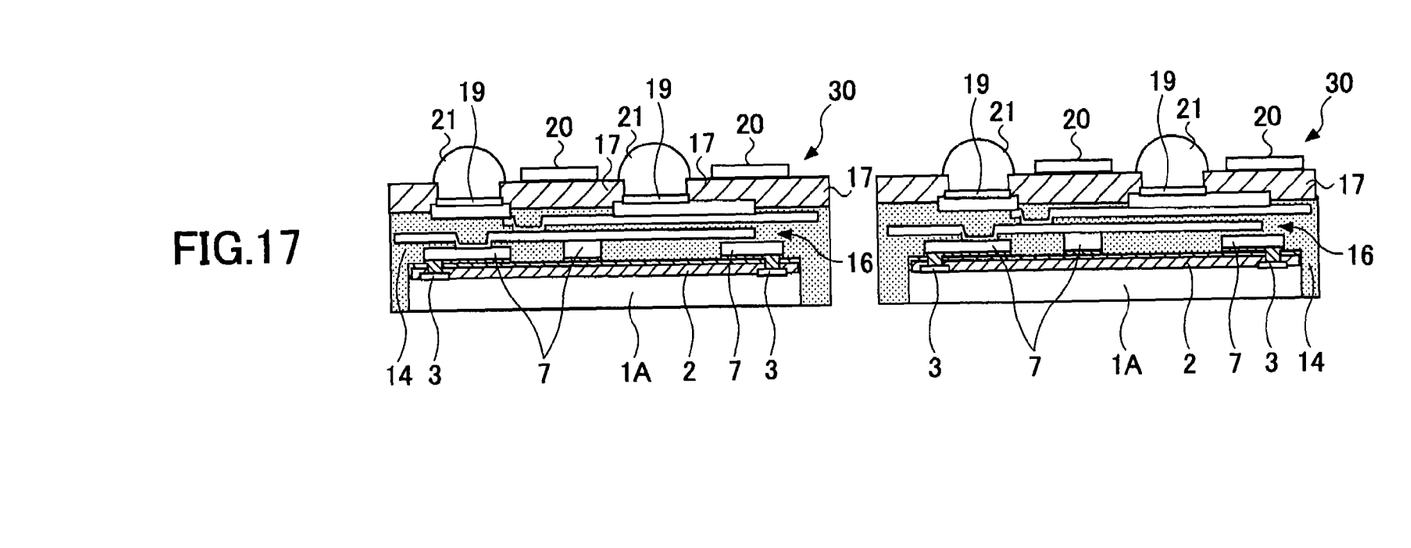
FIG. 17 illustrates the second dividing step according to the method of manufacturing a semiconductor device as an embodiment of the present invention.

After the semiconductor device continuous body 25 is formed as described above, the semiconductor device continuous body 25 is diced (or divided) into semiconductor devices 30 along a dicing line 22 by the dicing blade 12. The dicing line 22 is positioned within the clearance 13. To be more specific, the dicing line 22 is positioned on the outer surface of the second wiring layer on the clearance 13. The semiconductor device continuous body 25 is thus divided into the semiconductor devices 30. Then the semiconductor devices 30 are picked up from the dicing tape 10. In this way, the semiconductor devices 30 as shown in FIG. 17 are manufactured.

The dicing process is performed two times in this embodiment. Because the same dicing apparatus is used in both processes, there is no need to have different dicing apparatuses for each process. Therefore, the dicing processes are performed at low cost. The processes described with reference to FIGS. 16 and 17 correspond to "a second dividing step" as set forth in the following claims.

The following more specifically describes the processes for forming the clearance 13 between the semiconductor elements 1A illustrated in FIGS. 7 through 10 and the processes for forming the semiconductor device continuous body 25 illustrated in FIGS. 11 through 15 involved in the processes for manufacturing the semiconductor devices 30.

According to this embodiment, as previously mentioned, the wafer 1 is divided into the semiconductor elements 1A by the dicing process (first dividing step), and the clearance 13 is formed between the adjacent semiconductor elements 1A by stretching the dicing tape 10. When the build-up layer 16 is formed on the semiconductor elements 1A, the sealing resin 14 formed on the dicing tape 10 and filling the clearance 13 serves as a base plate for forming the build-up layer 16.

There are some comparisons between a case where the build-up layer 16 is formed without stretching the dicing tape 10 and a case where the build-up layer 16 is formed after stretching the dicing tape 10 and making the clearance 13 as in this embodiment.

In the case where the build-up layer 16 is formed without stretching the dicing tape 10, the area where the build-up layer 16 is formed has the same size as the area (areas indicated by arrows S1 in FIG. 15) where the semiconductor elements 1A are formed. That is, the build-up layer 16 cannot have a size larger than the area where the semiconductor elements 1A are formed.

In contrast, in the present embodiment, the clearance 13 is formed between the adjacent semiconductor elements 1A by stretching the dicing tape 10. The build-up layer 16 is then formed on the sealing resin 14 as a base plate encapsulating the semiconductor elements 1A and filling the clearance 13. That is, the build-up layer 16 is formed on the sealing resin 14 that is formed not only on the semiconductor elements 1A but also on the clearance 13, so that the areas (areas indicated by arrows S2 in FIG. 15) where the build-up layer 16 is formed become larger than the areas S1 where the semiconductor elements 1A are formed.

Therefore, the build-up layer 16 can be more flexibly designed and applied to the semiconductor elements 1A having high density. Even when the size of the semiconductor elements 1A of the wafer 1 is changed, the size change can be easily accommodated by adjusting the length of the clearance 13. In other words, the size of the area where the build up layer 16 is formed can be set regardless of the size of the semiconductor elements 1A, so that modification of the semiconductor elements 1A can be easily accepted.

The clearance 13 formed between the semiconductor elements 1A is filled with the sealing resin 14, and the upper surface of the sealing resin 14 is made smooth and flat. Therefore, accuracy and reliability of the build-up layer 16 can be assured although the build-up layer 16 extends over the clearance 13. Moreover, the physical strength of the semiconductor devices 30 is improved because side faces of the semiconductor elements 1A are covered with the sealing resin 14.

The present application is based on Japanese Priority Application No. 2004-141527 filed on May 11, 2004, with the Japanese Patent Office, the entire contents of which are hereby incorporated by reference.

What is claimed is:

1. A method of manufacturing a semiconductor device, comprising:
a first wiring layer forming step of forming a first wiring layer on an element forming surface of a semiconductor substrate on which plural semiconductor elements are formed;
a first dividing step of placing the semiconductor substrate on a stretchable base film with the element forming surface facing upward and performing a first dividing process where the semiconductor substrate placed on the base film is divided such that the plural semiconductor elements are separated from each other;
a clearance forming step of forming a clearance between the adjacent semiconductor elements by stretching the stretchable base film after the first dividing step;
a semiconductor element encapsulating step of encapsulating the separated plural semiconductor elements and filling the clearance between the adjacent semiconductor elements with a resin;
a via forming step of forming vias on the resin at positions corresponding to the first wiring layer;
a semiconductor device continuous body forming step of forming a semiconductor device continuous body by forming a second wiring layer on a surface of the resin such that the second wiring layer is connected to the first wiring layer through the vias; and
a second dividing step of performing a second dividing process where the semiconductor device continuous body is divided into plural of the semiconductor devices by cutting within the clearance.

2. The method of manufacturing a semiconductor device as claimed in claim 1, wherein the stretchable base film includes a stretchable dicing tape.

3. The method of manufacturing a semiconductor device as claimed in claim 1, wherein the first wiring layer forming step comprises:
forming electrodes and an insulating film made of a metal-containing resin so as to be exposed on the semiconductor substrate;
forming a seed layer on the electrodes and the insulating film by electroless plating;
forming a metal film pattern by electrolytic plating while using the seed layer as a power supply layer; and
forming the first wiring layer by etching the seed layer while using the metal film pattern as a mask.

4. The method of manufacturing a semiconductor device as claimed in claim 3, wherein the metal-containing resin includes an epoxy resin containing palladium.

5. The method of manufacturing a semiconductor device as claimed in claim 1, wherein the semiconductor device continuous body manufacturing step comprises:
forming the second wiring layer having multiple layers on the resin on which the vias are formed by a build-up method.

6. The method of manufacturing a semiconductor device as claimed in claim 1, wherein a dicing process is used for the first and second dividing processes.

7. The method of manufacturing a semiconductor device as claimed in claim 1, further comprising:
a backgrinding step of grinding a back surface opposite to the element forming surface of the semiconductor substrate before the first dividing step.

* * * * *